United States Patent
Wang et al.

[11] Patent Number: 5,977,809
[45] Date of Patent: Nov. 2, 1999

[54] PROGRAMMABLE NON-OVERLAP CLOCK GENERATOR

[75] Inventors: Shyh-Jye Wang; Chi-Chiang Wu, both of Hsinchu; Wen-Hsiang Huang, Kaohsiung, all of Taiwan

[73] Assignee: Taiwan Semiconductor Manufacturing Co., Ltd., Hsinchu, Taiwan

[21] Appl. No.: 08/968,558

[22] Filed: Nov. 12, 1997

[51] Int. Cl.⁶ .................................................. H03H 11/16
[52] U.S. Cl. ........................... 327/239; 327/251; 327/259
[58] Field of Search .................. 327/239, 243, 327/245, 250, 251, 258, 259

[56] References Cited

U.S. PATENT DOCUMENTS

| | | | |
|---|---|---|---|
| 5,059,818 | 10/1991 | Witt | 327/243 |
| 5,444,405 | 8/1995 | Truong | 327/239 |
| 5,453,707 | 9/1995 | Hiratsuka | 327/259 |
| 5,550,503 | 8/1996 | Garrity | 327/259 |

*Primary Examiner*—Timothy P. Callahan
*Assistant Examiner*—Hai L. Nguyen
*Attorney, Agent, or Firm*—McDermott, Will & Emery

[57] ABSTRACT

A programmable non-overlap clock generator is disclosed. This clock generator includes a primary clock signal input terminal for providing a primary clock signal, and a selection signal input terminal for providing at least one selection signal. The present invention also includes a first logic gate, whose first input terminal is coupled to receive an inverted signal of the primary clock signal. Further, the first input terminal of a second logic gate is coupled to receive the primary clock signal. A first programmable delay means, connected between an output of the first logic gate and the second input terminal of the second logic gate, is used to delay an output signal from the first logic gate a predetermined amount of time according to the selection signal. Moreover, a second programmable delay means, connected between an output of the second logic gate and the second input terminal of the first logic gate, is used to delay an output signal from the second logic gate a predetermined amount of time according to the selection signal. The programmable non-overlap clock generator therefore generates a first clock signal from the output of the first logic gate, and generates a second clock signal from the output of the second logic gate, wherein the first clock signal and the second clock signal are not logically active at the same time.

2 Claims, 9 Drawing Sheets

PROGRAMMABLE NON-OVERLAP CLOCK GENERATOR

BACKGROUND OF THE INVENTION

1. Field of the Invention

The present invention relates to a clock generator, and more particularly, to a programmable non-overlap clock generator that generates clock signals not logically active at the same time.

2. Description of the Prior Art

A shift register circuit is conventionally used to shift data through serially connected registers or latches. FIG. 1A shows a schematic diagram illustrating a typical shift register circuit 10 consisting of two serially connected registers DL1 and DL2, and FIG. 1B shows timing diagrams of the critical signals of FIG. 1A. A data input signal data2 is shifted from an input terminal Din of the first latch DL1 to an intermediate terminal Dint of the second latch DL2 at time t1 when a first clock signal phi1 is active (e.g., having a logic high level). The shifted data signal data2 is subsequently shifted from the intermediate terminal Dint to an output terminal Dout of the second latch DL2 at time t2 when a second clock signal phi2 is active (e.g., having a logic high level).

However, there are some parasitic capacitors and parasitic resistors caused by the material of the wiring in the shift register circuit 10, especially in shift register circuits implemented in an integrated circuit chip. FIG. 2A shows a schematic diagram illustrating a shift register circuit 20 with a parasitic capacitor C1 and a parasitic resistor R1 modeling the wire loading on the clock signal phi2. In this figure, the pertinent signals and components that are not changed in appearance from the arrangement of FIG. 1A are labeled with the same reference numerals. FIG. 2B shows timing diagrams of critical signals of FIG. 2A.

Referring to FIG. 2A, the clock signal phi2 is thus delayed due to the wire loading thereon, thereby generating a delayed clock signal phi2D inputting to the clock input terminal of the second latch DL2.

Referring now to FIG. 2B, the data input signal data2 is shifted from the input terminal Din of the first latch DL1 to the intermediate terminal Dint of the second latch DL2 at time t1 when the first clock signal phi1 is active (e.g., having a logic high level). At the same time, the delay clock signal phi2D remains active at its logic high level, therefore also shifting the data signal data2 to the output terminal Dout of the second latch DL2. Consequently, a preceding data signal data1, which is presumed to be at the output terminal Dout of the second latch DL2, is no longer there, and an unwanted data (i.e., the data signal data2 in this case) is thus retrieved. This situation is typically referred to as a race condition.

In order to overcome the aforementioned race condition, a non-overlap clock generator is disclosed to provide non-overlap clock signals. FIG. 3A schematically shows a diagram illustrating the non-overlap clock generator 30, whose output signals, i.e., the first clock signal phi1 and the second clock signal phi2, are shown in FIG. 3B. Owing to the guard band 31 between the non-overlap clock signals phi1 and phi2, it is thus guaranteed that the delayed clock signal phi2D does not overlap the first clock signal phi1, thereby preventing the race condition. Specifically, the data signal data2 is shifted from the input terminal Din of the first latch DL1 to the intermediate terminal Dint of the second latch DL2 at time t1. The output terminal Dout of the second latch DL2 has the data signal data1 until the delayed clock signal phi2D becomes active at time t2.

This non-overlap clock generator 30 primarily includes two standard NAND gates 301 and 302, and two delay components 303 and 304, cross-coupled as shown in FIG. 3A. FIG. 3C shows timing diagrams of some pertinent signals of FIG. 3A. The non-overlap space d in the non-overlap clock generator 30 is determined by both the delay time d1 of the delay component 304, and the delay time d2 of the NAND gate 302. Similarly, another non-overlap space 32 is determined by both the delay time of the delay component 303, and the delay time of the NAND gate 301. Since the delay time d2 is typically fixed by the intrinsic delayed and the loading of the NAND gate 301 or 302, therefore a suitable non-overlap space d is generally attained by adjusting the delay time d1 of the delay component 303 or 304. The selection of the delay time d1 is crucial for the following reasons. If it is too small, the race condition will occur and cause circuit malfunction. On the other hand, if a large non-overlap is chosen to guarantee that no race condition occurs, the performance of the chip will be unfortunately degraded due to the fact that the active states of the signals phi1 and phi2 are decreased. If the non-overlap space is increased without scarifying the active region of the clock signals phi1 and phi2, then the total period of the clock signals phi1 and phi2 should be increased, thereby slowing down the clock signals phi1, phi2, and degrading their performance. Moreover, because the delay time d1 determined by the two delay components 303 and 304 of the non-overlap clock generator 30 in FIG. 3A has a fixed value, therefore the non-overlap space can not be changed after the chip is fabricated. Another non-overlap clock generator 30 with different non-overlap space should be redesigned and fabricated when a different application is required, thereby wasting time and money.

SUMMARY OF THE INVENTION

In accordance with the present invention, a programmable non-overlap clock generator is provided so that the non-overlap space between the generated clocks can be programmed, substantially optimizing clock speed and increasing the performance of shift register circuits. In one embodiment, a primary clock signal input terminal provides a primary clock signal, and a selection signal input terminal provides at least one selection signal. The present invention also includes a first logic gate having a first input terminal and a second input terminal, wherein the first input terminal of the first logic gate is coupled to receive an inverted signal of the primary clock signal. A second logic gate includes a first input terminal and a second input terminal, wherein the first input terminal of the second logic gate is coupled to receive the primary clock signal. A first programmable delay circuit is coupled to receive an output of the first logic gate, wherein an output of the first programmable delay circuit is coupled to the second input terminal of the second logic gate. Further, a second programmable delay circuit is coupled to receive an output of the second logic gate, wherein an output of the second delay circuit is coupled to the second input terminal of the first logic gate. The programmable non-overlap clock generator according to the present invention therefore generates a first clock signal from the output of the first logic gate, and generates a second clock signal from the output of the second logic gate, wherein the first clock signal and the second clock signal are not logically active at the same time.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
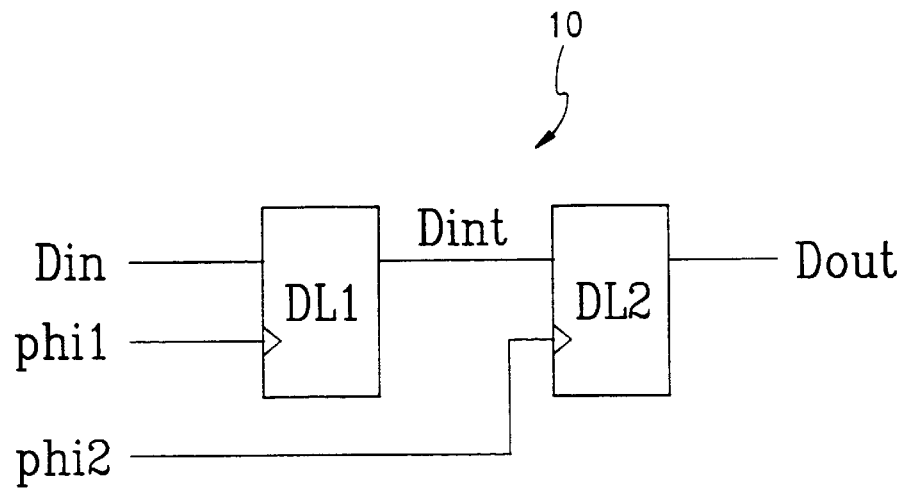
FIG. 1A shows a schematic diagram illustrating a typical shift register circuit.
Figure 1B:
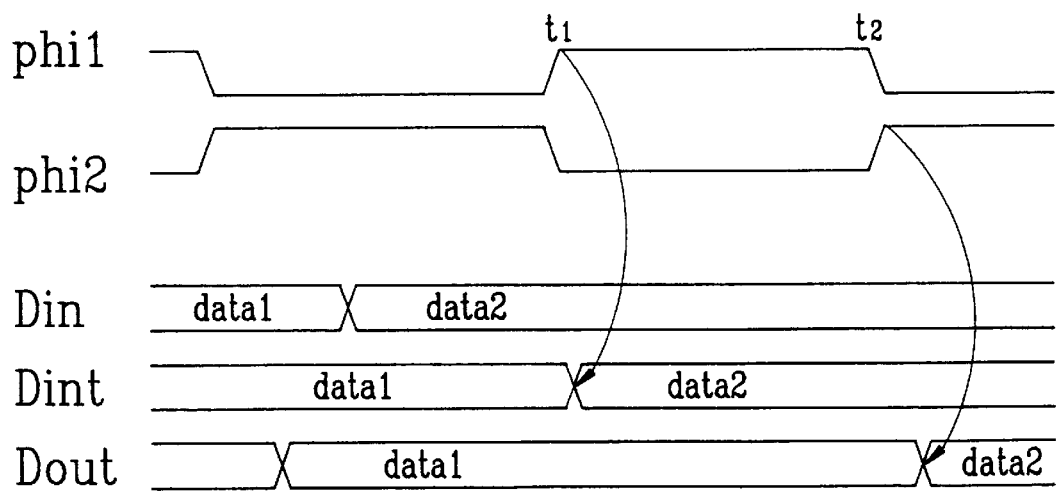
FIG. 1B shows timing diagrams of the critical signals of FIG. 1A.
Figure 2A:
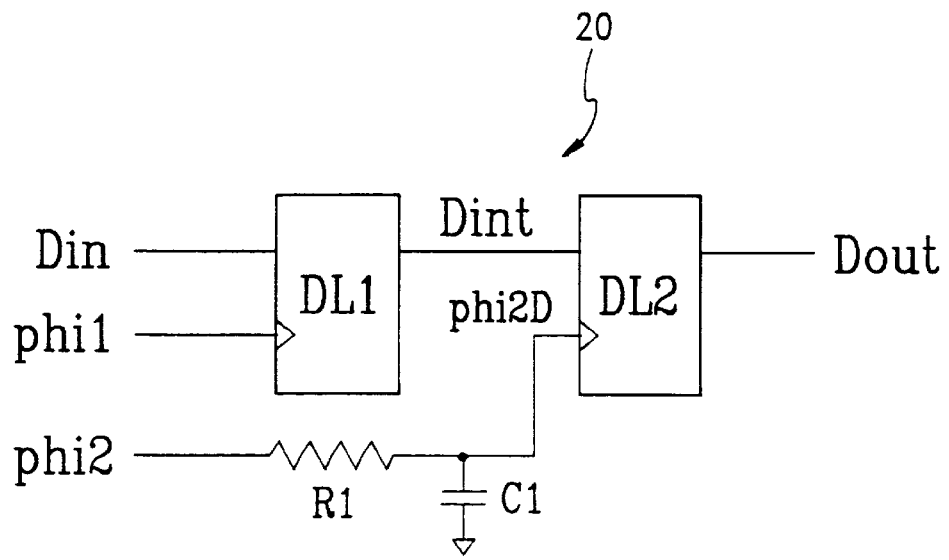
FIG. 2A shows a schematic diagram illustrating a shift register circuit with a parasitic capacitor and a parasitic resistor.
Figure 2B:
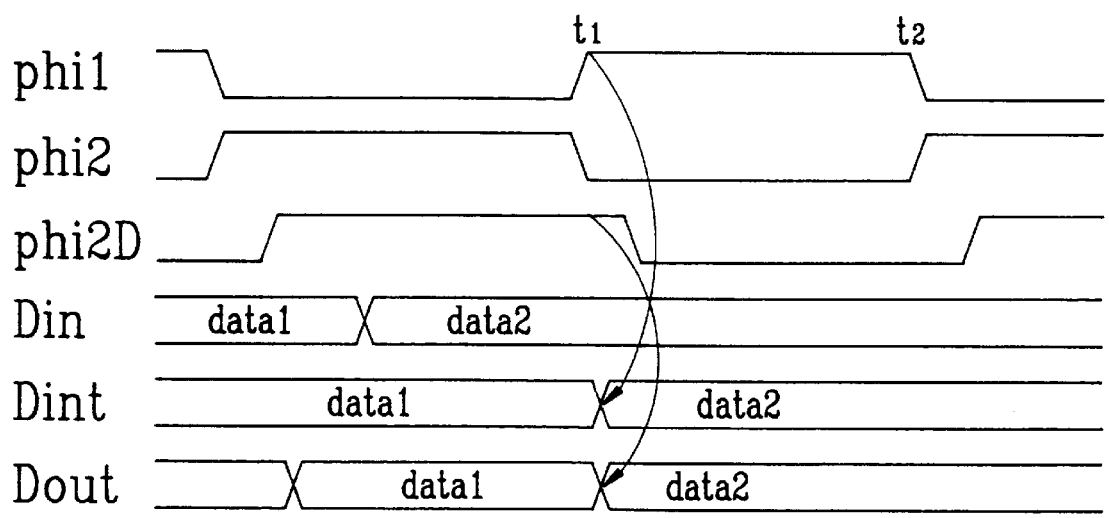
FIG. 2B shows timing diagrams of critical signals of FIG. 2A.
Figure 3A:
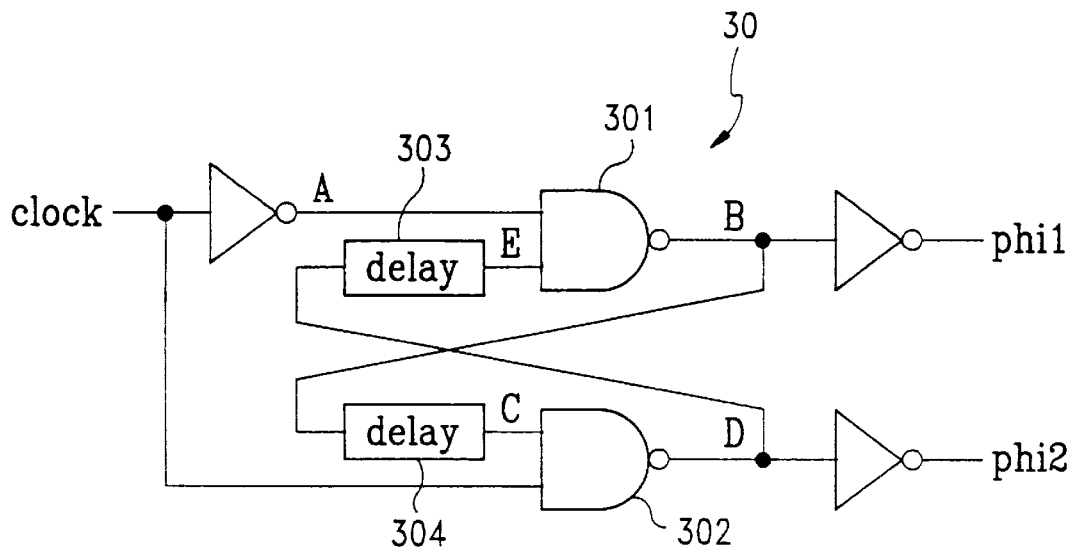
FIG. 3A shows a schematic diagram illustrating a non-overlap clock generator.
Figure 3B:
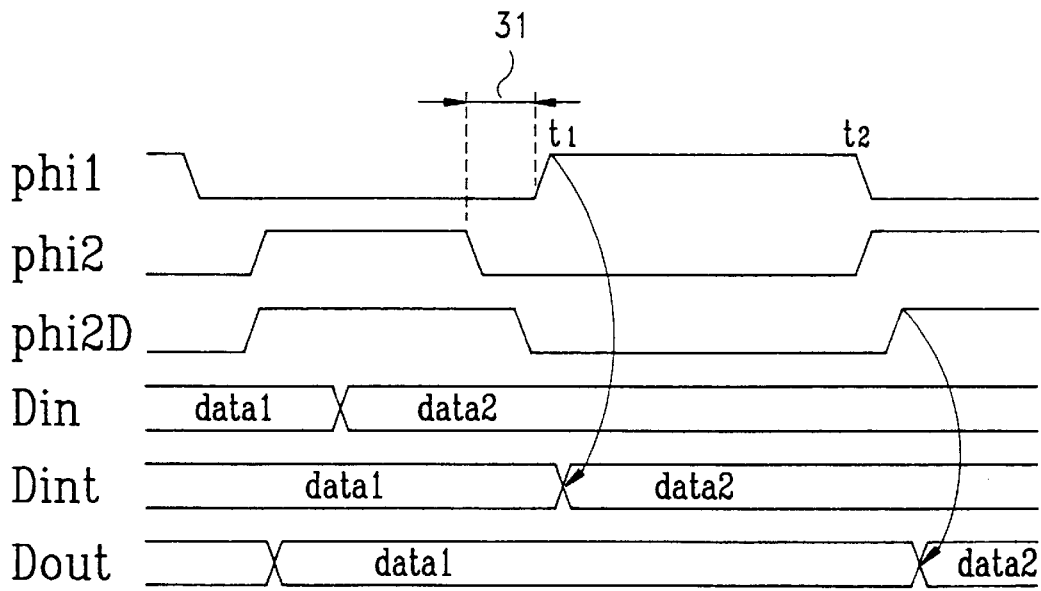
FIG. 3B shows timing diagrams of the output clock signals of FIG. 3A.
Figure 3C:
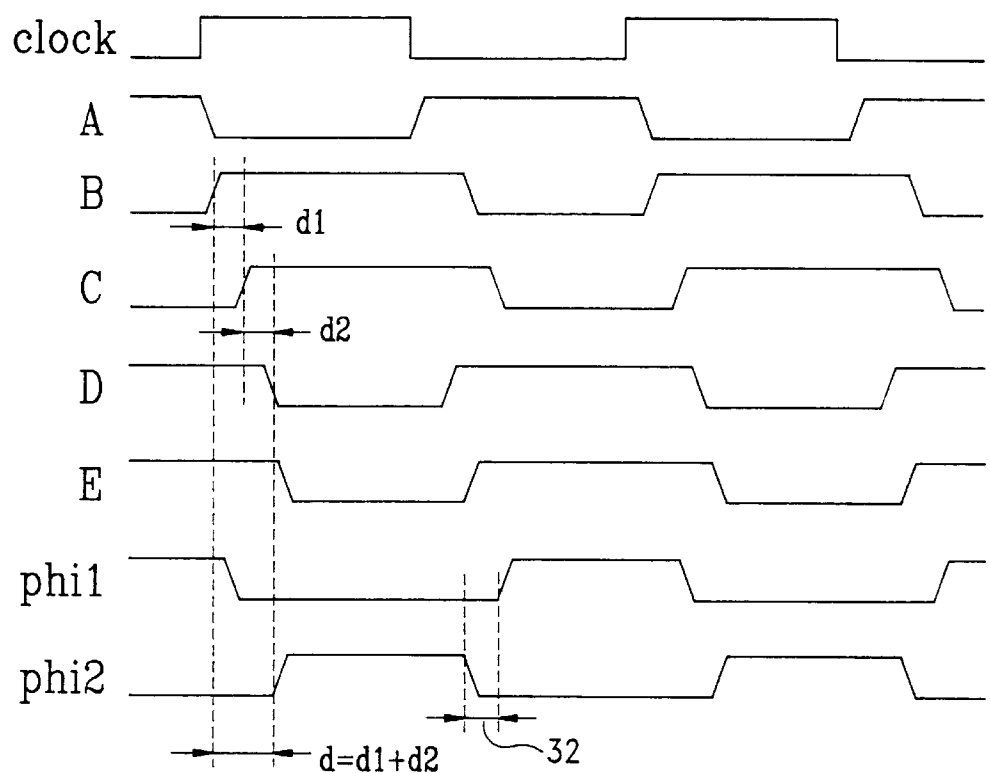
FIG. 3C shows timing diagrams of some pertinent signals of FIG. 3A.
Figure 4A:
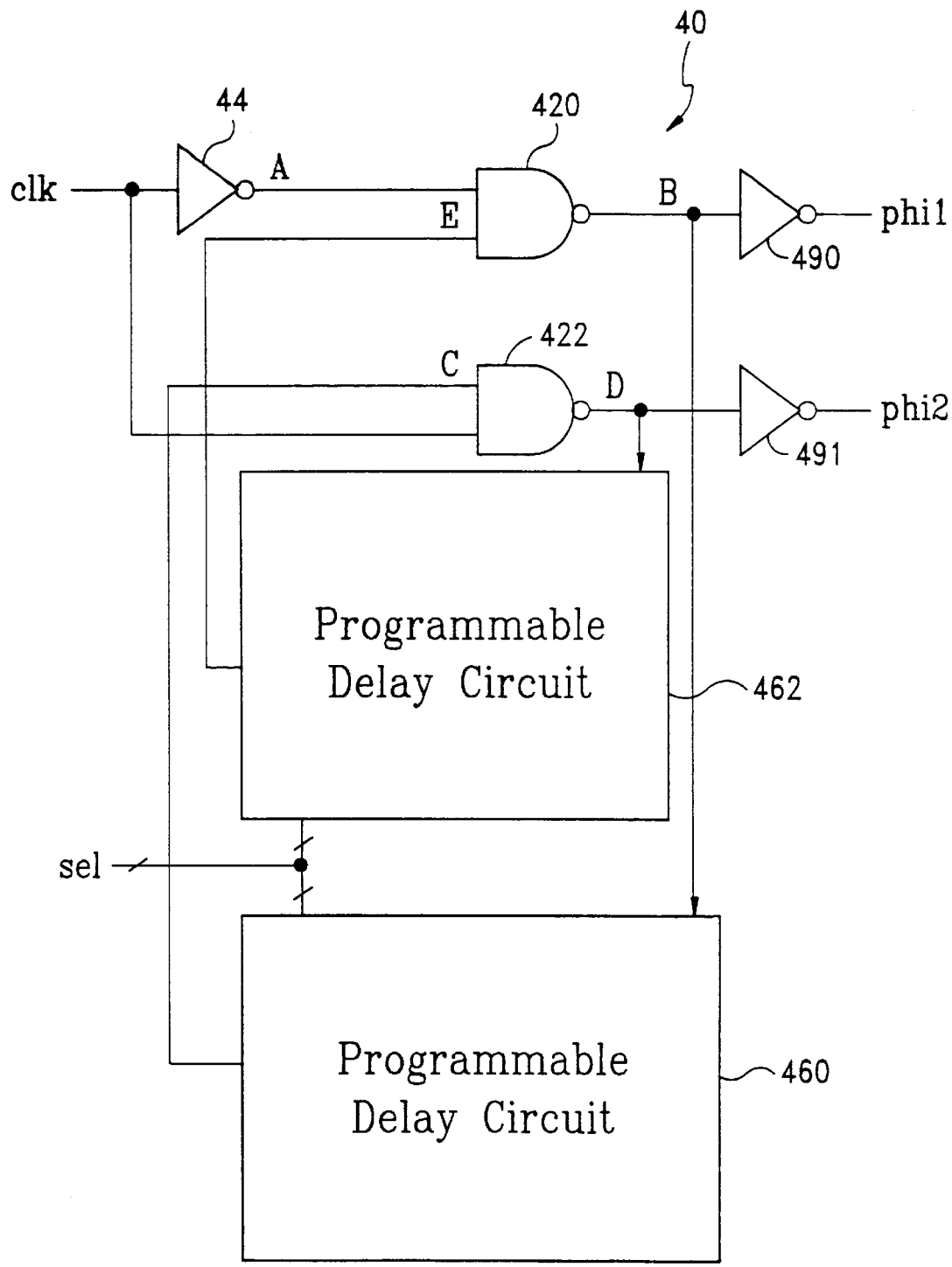
FIG. 4A shows a schematic diagram of a programmable non-overlap clock generator.
Figure 4B:
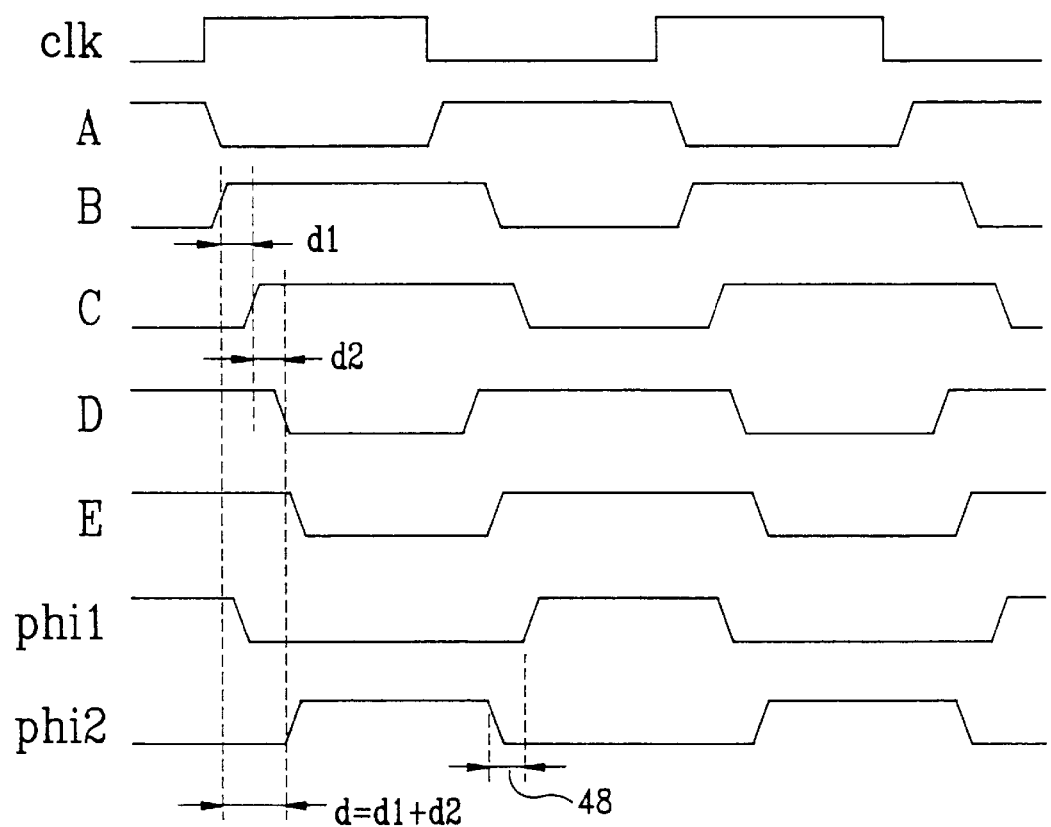
FIG. 4B shows timing diagrams of some pertinent signals of FIG. 4A.

FIG. 4A shows a schematic diagram of a programmable non-overlap clock generator 40. This clock generator 40 includes two standard NAND gates, i.e., the first NAND gate 420 and the second NAND gate 422. A primary clock signal clk is input to a first input terminal of the second NAND gate 422, and an inverted primary clock signal generated by an inverter 44 at node A is input to a first input terminal of the first NAND gate 420. The output terminal of the first NAND gate 420 is cross-coupled to a second input terminal of the second NAND gate 422 via a delay path determined by a first programmable delay circuit 460. Similarly, the output terminal of the second NAND gate 422 is cross-coupled to a second input terminal of the first NAND gate 420 via a delay path determined by a second programmable delay circuit 462. The first programmable delay circuit 460 and the second programmable delay circuit 462 are used to delay the output signal of the first NAND gate 420 and the output signal of the second NAND gate 422, respectively, a predetermined amount of time according to at least a selection signal sel. The predetermined amount of time is thus programmable (or adjustable) according to a different value of the selection signal (or signals). It is appreciated that the first programmable delay circuit 460 and the second programmable delay circuit 462 can alternatively be controlled individually by two selection signals with different value. Timing diagrams representing some pertinent signals of FIG. 4A are shown in FIG. 4B. The non-overlap space d in the programmable non-overlap clock generator 40 is determined by both the delay time d1 of the first programmable delay circuit 460, and the delay time d2 of the NAND gate 422. Similarly, another non-overlap space 48 is determined by the delay time of the selected delay component in the second programmable delay circuit 462 and the delay time of the NAND gate 420.

As the delay times of the NAND gate is generally fixed by the intrinsic delay and the loading thereof, therefore suitable non-overlap space d is determined by the first programmable delay circuit 460. The non-overlap space can be selected or programmed even after the chip is fabricated, and therefore an optimized clock speed can be achieved, thereby enhancing the performance of the shift register circuits.

In FIG. 4A, buffers 490 and 491 are optionally and preferably connected to the output of the NAND gates 420 and 422 respectively to increase their driving capability.

Figure 4C:
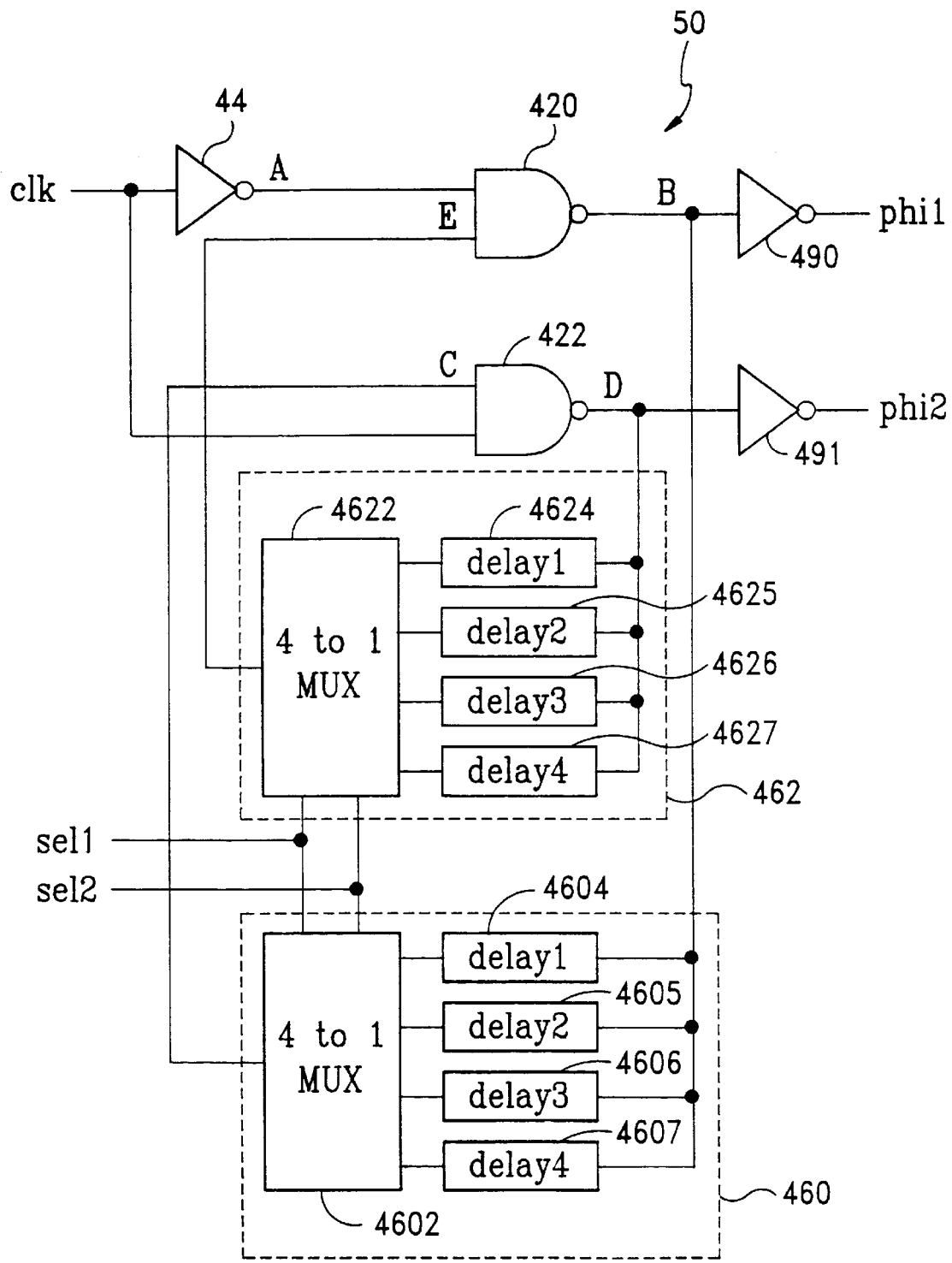
FIG. 4C shows a schematic diagram of a programmable non-overlap clock generator according to one embodiment of the present invention.

FIG. 4C shows a schematic diagram of a programmable non-overlap clock generator 50 according to one embodiment of the present invention. This clock generator 50 includes two standard NAND gates, i.e., the first NAND gate 420 and the second NAND gate 422. A primary clock signal clk is input to a first input terminal of the second NAND gate 422, and an inverted primary clock signal generated by an inverter 44 at node A is input to a first input terminal of the first NAND gate 420. The output terminal of the first NAND gate 420 is cross-coupled to a second input terminal of the second NAND gate 422 via a delay path determined by a first delay circuit 460. Similarly, the output terminal of the second NAND gate 422 is cross-coupled to a second input terminal of the first NAND gate 420 via a delay path determined by a second delay circuit 462. In this embodiment, the first programmable delay circuit 460 includes four parallel-configured delay components designated as delay1 4604, delay2 4605, delay3 4606, and delay4 4607. The second programmable delay circuit 462 also includes four parallel-configured delay components designated as delay1 4624, delay2 4625, delay3 4626, and delay4 4627. Further, all of the delay components in the first programmable delay circuit 460 or the second delay circuit 462 are respectively connected to a combinational logic device 4602 or 4622, which has many input terminals and usually has just one output. In this embodiment, a standard 4-to-1 multiplexer (MUX) is used as the aforementioned combinational logic device 4602 or 4622. For each multiplexer 4602 or 4622, one of its input is selectively connected at a time to the output terminal of the multiplexer, wherein the selection is achieved by sending a pair of selection signals sel1 and sel2 to the multiplexer 4602 and 4622. Timing diagrams representing some pertinent signals of FIG. 4A are shown in FIG. 4B. The non-overlap space d in the programmable non-overlap clock generator 50 is determined by both the delay time d1 of the first programmable delay circuit 460, and the delay time d2 of the NAND gate 422. Further, the delay time d1 is the sum of the delay time of the selected delay component, and the delay time of the multiplexer 4602. Similarly, another non-overlap space 48 is determined by the delay time of the selected delay component in the second programmable delay circuit 462, and the delay time of the NAND gate 420.

As the delay times of the NAND gate and the multiplexer are generally fixed by the intrinsic delay and the loading thereof, therefore suitable non-overlap space d is generally attained by selecting an appropriate delay component in the first programmable delay circuit 460. The non-overlap space can be selected or programmed even after the chip is fabricated, and therefore an optimized clock speed can be achieved, thereby enhancing the performance of the shift register circuits. In this embodiment, these delay components are constructed by connecting even number of inverter as shown in FIGS. 5A to 5D. A required delay time is thus attainable by adjusting the size or/and the number of the inverter.

Figure 4D:
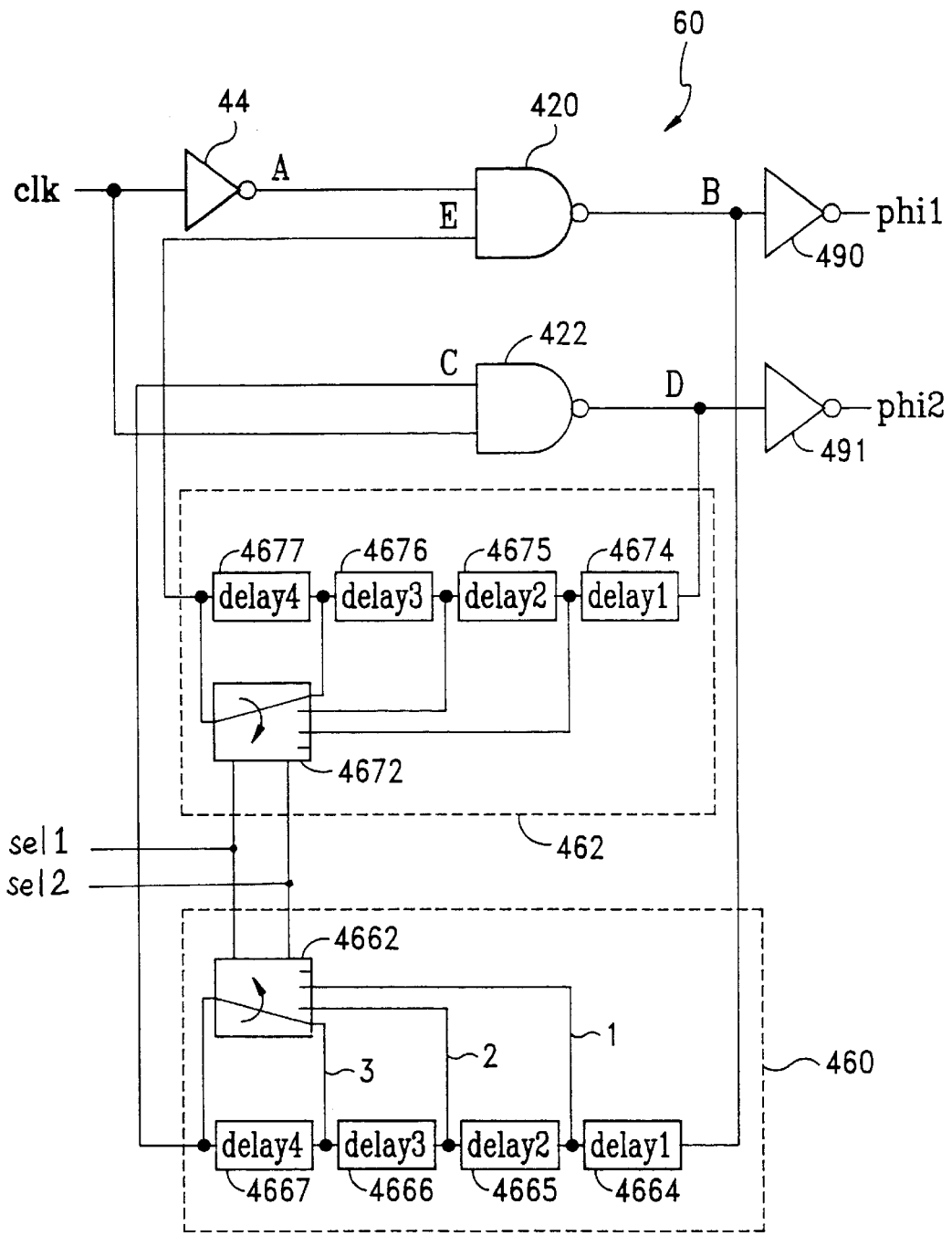
FIG. 4D shows a schematic diagram of a programmable non-overlap clock generator according to another embodiment of the present invention.
Figure 5A:
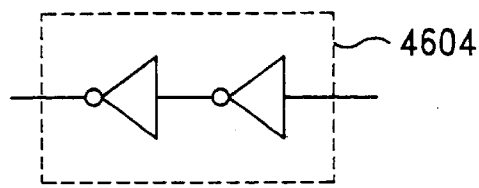
FIGS. 5A to 5D shows coupled inverters that construct the delay components according to the embodiment of FIG. 4C.
Figure 5B:
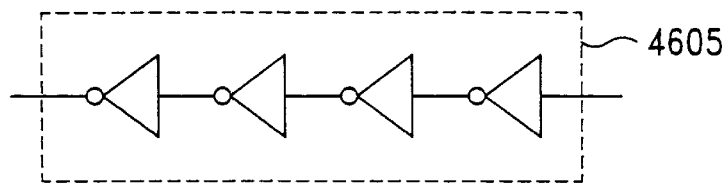
Figure 5C:
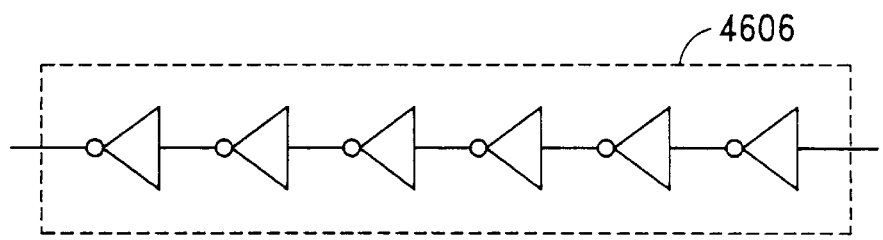
Figure 5D:
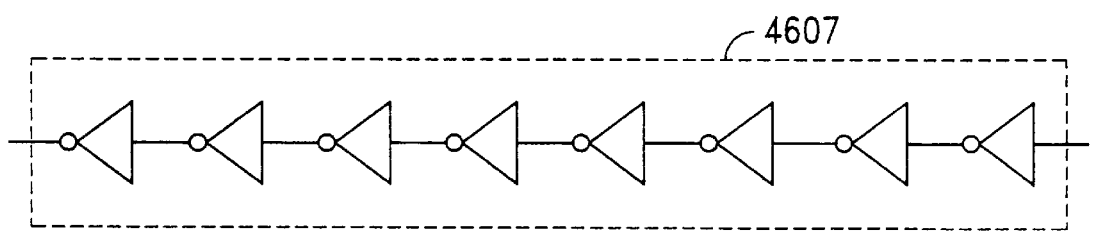

FIG. 4D shows a schematic diagram of a programmable non-overlap clock generator 60 according to another embodiment of the present invention. This clock generator 60 includes two standard NAND gates, i.e., the first NAND gate 420 and the second NAND gate 422. A primary clock signal clk is input to a first input terminal of the second NAND gate 422, and an inverted primary clock signal generated by an inverter 44 at node A is input to a first input terminal of the first NAND gate 420. The output terminal of the first NAND gate 420 is cross-coupled to a second input terminal of the second NAND gate 422 via a delay path determined by a first delay circuit 460. Similarly, the output terminal of the second NAND gate 422 is cross-coupled to a second input terminal of the first NAND gate 420 via a delay path determined by a second delay circuit 462. In this embodiment, the first programmable delay circuit 460 includes four serial-connected delay components designated as delay1 4674, delay2 4675, delay3 4676, and delay4 4677. The second programmable delay circuit 462 also includes four serial-connected delay components designated as delay1 4664, delay2 4665, delay3 4666, and delay4 4667. Further, the delay path of the delay components in the first programmable delay circuit 460 or the second delay circuit 462 is controlled by a switch 4662 or 4672, respectively. For example, if the first connector 1 is chosen, the delay path is determined by the delay1 4664. If neither of the connectors 1, 2, and 3 is chosen, the delay path is determined by all of the delay1 4664, the delay2 4665, the delay3 4666, and the delay4 4667.

It is appreciated that some portion of the programmable non-overlap clock generator may be modified without departing from the claimed scope of the invention. For example, the NAND gates 420 and 422 can be replaced by standard NOR gates. Further, the multiplexer 4622 and 4620 can be individually and differently controlled by different set of selection signals. Although specific embodiments have been illustrated and described, it will be obvious to those skilled in the art that various modifications may be made without departing from the spirit which is intended to be limited solely by the appended claims.

What is claimed is:

1. A programmable non-overlap clock generator, consisting essentially of:

a primary clock signal input terminal for providing a primary clock signal;

a selection signal input terminal for providing at least one selection signal;

a first NAND gate having a first input terminal and a second input terminal, the first input terminal of said second NAND gate being coupled to receive an inverted signal of said primary clock signal;

a second NAND gate having a first input terminal and a second input terminal, the first input terminal of said second NAND being coupled to receive said primary clock signal;

a plurality of first delay components coupled to receive an output of said first NAND gate;

a first multiplexer coupled to said plurality of first delay components, one of said first delay components being then selected by said first multiplexer in response to said selection signal to be as an output of said first multiplexer, said output of said first multiplexer then being coupled to the second input terminal of said second NAND gate;

a plurality of second delay components coupled to receive an output of said second NAND gate;

a second multiplexer coupled to said plurality of second delay components, one of said second delay components being then selected by said second multiplexer in response to said selection signal to be as an output of said second multiplexer, said output of said second multiplexer then being coupled to the second input terminal of said first NAND gate;

a first buffer coupled to the output of said first NAND gate;

a second buffer coupled to the output of said second NAND gate;

thereby generating a first clock signal from the output of said first buffer and generating a second clock signal from the output of said second buffer, wherein the first clock signal and the second clock signal are not logically active at the same time.

2. The clock generator according to claim 1, wherein each of said first and second delay components comprises an even number of inverters.

* * * * *